| United States Patent [19] | [11] | 4,175,177 |
|---|---|---|
| Potts | [45] | Nov. 20, 1979 |

[54] CROSSLINKABLE COPOLYMER OF A LACTONE AND A POLYFUNCTIONAL ACRYLATE

[75] Inventor: James E. Potts, Somerset, N.J.

[73] Assignee: Union Carbide Corporation, New York, N.Y.

[21] Appl. No.: 880,955

[22] Filed: Feb. 24, 1978

[51] Int. Cl.$^2$ ............................................. B01F 11/00
[52] U.S. Cl. ....................................... 528/354; 128/77; 128/80 R; 204/159.14; 204/159.15; 264/22; 528/355; 528/357; 528/358; 528/361; 528/392
[58] Field of Search ............... 528/354, 361, 392, 355, 528/357, 358

[56] References Cited

U.S. PATENT DOCUMENTS

| 3,795,701 | 3/1974 | Jenkins et al. | 260/484 A |
| 3,855,357 | 12/1974 | Harris et al. | 260/897 C |
| 3,969,323 | 7/1976 | Furrer et al. | 260/73 R |

FOREIGN PATENT DOCUMENTS

847404 10/1976 Belgium.
43-5908 4/1968 Japan.

*Primary Examiner*—Richard B. Turer
*Attorney, Agent, or Firm*—Bernard Francis Crowe

[57] ABSTRACT

Thermoplastic, crosslinkable copolymer is produced by reacting an active-hydrogen containing initiator with a lactone monomer, such as epsilon-caprolactone, and a polyfunctional acrylate, such as neopentyl glycol diacrylate. The copolymer can be crosslinked by exposure to ionizing or actinic radiation or by free-radical peroxide catalysts. The degree of crosslinking can be controlled to produce a material which is thermoplastically processable and displays modified rheological properties which make it more easily processable than the corresponding lactone homopolymer.

13 Claims, 2 Drawing Figures

CROSSLINKABLE COPOLYMER OF A LACTONE AND A POLYFUNCTIONAL ACRYLATE

BACKGROUND OF THE INVENTION

Solid, thermoplastic polymers of lactone esters have been known in the art for some time. U.S. Pat. No. 3,169,945 describes a method for producing such polymers whereby a molar excess of a lactone monomer is reacted with an active-hydrogen containing initiator that is capable, with or without the aid of a catalyst, of opening the lactone ring and adding it as an open chain without forming water of condensation. The solid polymers which can be produced by this method are highly crystalline and display sharp melting points.

Typical uses of the thermoplastic polylactone polymers include their use as a material of construction for orthopedic casts, splints, and similar devices, as described in U.S. Pat. No. 3,692,023; and their use as plasticizers for vinyl resin compositions, as described in U.S. Pat. No. 3,592,877.

The rheological characteristics of the solid lactone polymers have proven to be an obstacle to their more widespread use in certain applications. The melt index of the polymers rises sharply as the temperature is increased above the melting point. Except at quite high molecular weights (i.e., reduced viscosity greater than about 0.8), the polymer is difficult to extrude in sheet form, since the molten extrudate has poor dimensional stability. Costly chill roll equipment must generally be employed to reduce the temperature of the extruded sheet as quickly as possible upon emergence from the sheet die. In blown film applications, the extrudate usually will not form a self-supporting film bubble at reduced viscosities below about 1.5. It is very difficult to produce such high viscosity material in conventional commercial polymerization equipment.

The rheological properties of the lactone polymers have hindered their more widespread acceptance in the field of orthopedic casts, despite the fact that the casts produced from them have excellent properties, i.e. they are lightweight, tough, rigid, water and soil resistant, and easily removed. The polymer must be heated above its melting point in order to apply it as an orthopedic cast material. At the application temperature, the polymer tends to be more fluid than is desired and, therfore, difficult to handle and apply.

SUMMARY OF THE INVENTION

The present invention provides a novel copolymer containing a major amount of lactone monomer and a minor amount of a polyfunctional acrylate copolymerized therein. The copolymer is produced under essentially the same reaction conditions which are known to polymerize the lactone alone with the active-hydrogen containing initiator, except that the polyfunctional acrylate is additionally present in the polymerization reaction mixture.

The thermoplastic, crosslinkable copolymers of this invention display no significant degree of crosslinking themselves—as measured by gel content—yet they are highly susceptible to crosslinking by exposure to actinic or ionizing radiation. It was quite surprising that the copolymers produced in this manner displayed these properties. On the basis of the known mechanism of lactone polymerization and the structure of the polyfunctional acrylate monomers, it would be expected either that the polyfunctional acrylate would not co-react in the polymerization reaction mixture or that, if it did react, the reaction product itself would be highly crosslinked. Yet, this was not the case. Analysis of the double bond content of the thermoplastic, crosslinkable copolymer of this invention indicated that, where a difunctional acrylate was employed, approximately half the double bonds initially present in the difunctional acrylate monomer were consumed in the polymerization reaction, indicating reaction of at least a major portion of the difunctional acrylate. Based on solubility and melt index behavior, the thermoplastic, crosslinkable copolymers themselves show little or no evidence of crosslinking.

The thermoplastic, crosslinkable copolymers of this invention can be crosslinked by heat and free radical peroxide catalysts, however, we prefer to crosslink them by exposure to ionizing or actinic radiation, such as electron beam or ultraviolet radiation. The thermoplastic, crosslinkable copolymers are remarkable in their response to actinic radiation. In comparing the thermoplastic copolymers of this invention with physical blends of lactone homopolymer and polyfunctional acrylate, the copolymers exhibited a much more rapid crosslinking response to electron beam irradiation, determined by measuring melt index as a function of radiation dosage.

The degree of crosslinking which is imparted to the thermoplastic, crosslinkable copolymer is readily controllable according to the desires of the practitioner, for example, by controlling the dosage of radiation. By controlling the degree of crosslinking, one can produce a range of crosslinked copolymers which display varying rheological properties. At one end of the spectrum, one can produce a lightly crosslinked copolymer (e.g. no detectable gel in methylene dichloride at 35° C.) which is processable by all the conventional thermoplastic processing methods, such as extrusion, yet displays melt properties which are more desirable than the corresponding lactone homopolymers of similar reduced viscosity. It is thus possible to extrude sheets of the lightly crosslinked copolymer without the use of chill roll equipment and to blow film from the crosslinked copolymer at considerably lower reduced viscosities (i.e., molecular weights) than is possible with the corresponding lactone homopolymer. At higher levels of crosslinking, wherein the copolymer contains a gel phase, it exhibits a soft, rubbery consistency over a fairly broad temperature range. In applications such as orthopedic casts and splints, such a material is much easier to handle during the application process than the corresponding lactone homopolymer.

The thermoplastic, crosslinkable copolymers display physical and mechanical properties at room temperature which are similar to those of lactone homopolymers having considerably higher molecular weight.

DETAILED DESCRIPTION OF THE INVENTION

The thermoplastic, crosslinkable copolymer of this invention is produced by reacting, at a temperature of from 25° to 300° C., an active-hydrogen containing initiator with a molar excess of a monomer mixture comprising:

(A) from 90 to 99.5 weight percent preferably from 95 to 99.5 weight percent of at least one lactone of the formula:

wherein n is an integer having a value of from about 3 to 6, at least n+2 of the R's are hydrogen and the remaining R's are alkyl of up to 10 carbons; and (B) from 0.5 to 10 weight percent preferably from 0.5 to 5 weight percent, of a polyfunctional acrylate.

As used in this specification and claims, the term "polyfunctional acrylate" means any of the di-, tri-, or tetrafunctional acrylate or methacrylate esters defined by the formula:

wherein D is hydrogen or methyl, x has a value of 1 to 3, R' is wherein each X is hydrogen or —O—, Y is —O—, methyl, or Z is hydrogen or alkyl of 1 to 2 carbon atoms, m has a value of from 2 to 6, and y has a value from 2 to 15.

Illustrative of the lactone monomers useful in this invention one can mention epsilon-caprolactone, zeta-enantholactone, delta-valerolactone, the monoalkyl-delta-valerolactone, e.g., the monomethyl-, monoethyl-, mono-n-hexyl-delta-valerolactones, and the like; the monoalkyl-, dialkyl-, and trialkyl-epsilon-caprolactones, e.g., the monomethyl-, monoethyl-, mono-n-propyl-, dimethyl-, diethyl-, di-n-propyl, trimethyl-, triethyl-, tri-n-propyl-epsilon-caprolactones, and the like.

One can mention, as illustrative of the polyfunctional acrylates described by the formulas above, neopentyl glycol diacrylate, neopentyl glycol dimethacrylate, trimethylolpropane triacrylate, trimethylolpropane trimethacrylate, butanediol diacrylate, butanediol dimethacrylate, 3'-acryloxy-2',2'-dimethylpropyl 3-acryloxy-2,2-dimethylpropionate, ethylene glycol diacrylate, diethylene glycol diacrylate, triethylene glycol triacrylate, pentaerythritol tetraacrylate, and the like.

Those skilled in the art are aware that, in producing the polyfunctional acrylates by esterfying the corresponding polyfunctional alcohols, a small number of residual hydroxyl groups may be present in the product. A small amount of such groups is tolerable in producing the thermoplastic, crosslinkable copolymer, however, they will act as initiators and their effect on the molecular weight should be taken into consideration.

The identity of the active-hydrogen containing initiators and the reaction conditions which promote the copolymerization of the lactone and polyfunctional acrylate, including the nature of useful catalysts, are essentially the same as those which are known to promote the polymerization of the lactone monomer alone in the presence of the active-hydrogen containing initiator. The polymerization of lactone monomers with active-hydrogen containing initiators is known in the art and is described in U.S. Pat. No. 3,169,945.

The active-hydrogen containing initiators which are useful in producing the thermoplastic crosslinkable copolymers are known to those skilled in the art. They are compounds having one or more reactive hydrogen atoms which are capable, under the conditions of reaction, of opening the lactone ring and adding it as an open chain without forming water of condensation. Water is a suitable initiator for the reaction. Frequently, the ambient moisture absorbed in the lactone monomer and polyfunctional monomer is sufficient to initiate the reaction. Other suitable initiators include monofunctional initiators, such as alcohols and amines, and polyfunctional initiators, such as polyols and polyamines, as well as amides, sulfonamides, hydrazones, semicarbazones, oximes, polycarboxylic acids, hydrocarboxylic acids, and aminocarboxylic acids.

As merely illustrative of suitable active-hydrogen initiators one can mention: alcohols such as methanol, ethanol, propanol, isopropanol, 1-butanol, 2-butanol, tert-butanol, 1-pentanol, 3-pentanol, tert-amyl alcohol, 1-hexanol, 4-methyl-3-pentanol, 1-heptanol, 1-octanol, 1-nonanol, 3,9-triethyl-6-decanol, lauryl alcohol. benzyl alcohol, phenyl methyl carbinol, cyclohexanol, trimethylcyclohexanol; diols such as ethylene glycol, diethylene glycol, triethylene glycol, and the like, 2,2-dimethyl-1,3-propanediol, 2,2-diethyl-1,3-propanediol, 3-methyl-1,5-pentanediol, N-methyl and N-ethyl diethanolamines, 1,3- or 1,4-cyclohexanediol, 4,4-methylenebiscyclohexanediol, 1,3- or 1,4-xylenediol, 3- or 4-hydroxymethyl-phenethyl alcohol, and 1,4-piperazinediethanol; amines such as methylamine, ethylamine, n-propylamine, isopropylamine, n-butylamine, tertbutylamine, n-amylamine, n-hexylamine, 2-ethylhexylamine, aniline, orthotoluene, cyclohexylamine, pyrrolidone, piperidine, and morpholine; and diamines such as methylenediamine, ethylenediamine, n-propylenediamine, meta- or paraphenylenediamine, toluene-2,4-diamine, 1,5-naphthalenediamine, meta- or paraxylylenediamine, 1,4-cyclohexanediamine, and 4,4'-methylenebiscyclohexylamine.

The above listing of suitable active-hydrogen containing initiators which can be used in the production of the thermoplastic, crosslinkable copolymer is intended to be illustrative only, and a more complete listing can be found in U.S. Pat. No. 3,169,945, Cols. 2–7.

The polymerization of the lactone and the polyfunctional acrylate is preferably carried out in the presence of a lactone polymerization catalyst, such as a basic or neutral ester interchange catalyst. Among catalysts suitable for this purpose are such metals as lithium, sodium, potassium, rubidium, cesium, magnesium, calcium, barium, strontium, zinc, aluminum, titanium, cobalt, germanium, tin, lead, antimony, arsenic, and cerium, as well as the alkoxides thereof. Additional suitable catalysts, by way of example, are the carbonates of alkali- and alkaline earth metals, zinc borate, lead borate, zinc oxide, lead silicate, lead arsenate, litharge, lead carbonate, antimony trioxide, stannous octoate, and aluminum isopropoxide. The catalysts are employed in the usual known catalytically effective concentrations. Typically, the catalysts are employed at concentrations between about 0.001 to 0.5%, preferably from 0.01 to 0.2%, based on the weight of the lactone monomer.

As previously mentioned, the reaction of the lactone monomer, polyfunctional acrylate, and active-hydrogen containing initiator is carried out at a temperature of from 25° to 300° C., and, preferably it is carried out at from 130° to 225° C. The reaction proceeds satisfactorily at atmospheric pressure, ambient reactor pressure, or superatmospheric pressure. Generally, it is not necessary to carry out the reaction in a solvent, however, a conventional organic solvent can be employed, provided it does not contain active-hydrogen atoms which will act as polymerization initiators. Reaction time varies widely, depending on the type and amount of initiator, lactone, polyfunctional acrylate and catalyst, reaction temperature, desired molecular weight, reactor design, etc., and can be anywhere from a few minutes to 40 hours or more. The product is recovered by conventional means.

The thermoplastic, crosslinkable copolymers of this invention are solid at room temperature. They have reduced viscosities from about 0.1 to 2.0, measured at a concentration of 2 grams/ml. in benzene.

The thermoplastic, crosslinkable copolymer can be crosslinked by exposure to the known forms of actinic or ionizing radiation. Suitable forms of radiation for crosslinking the copolymer include electron beam, alpha-ray, beta-ray, x-ray, gamma-ray, and ultraviolet light. The equipment for generating these forms of radiation is known and requires no further elaboration herein. We prefer to employ electron beam energy for crosslinking the copolymer because of its excellent penetrating ability, because it does not require the use of added photoinitiator, and because the equipment for generating this energy is readily commercially available.

If one desires to crosslink the copolymer using non-ionizing radiation, such as ultraviolet, a photoinitiator is blended with the thermoplastic, crosslinkable copolymer prior to crosslinking. Any of the known photoinitiators are suitable. One can mention, as merely illustrative thereof, 2,2-diethoxyacetophenone, benzophenone, acetophenone, 2-, or 3-, or 4-bromoacetophenone fluorenone, xanthone, thioxanthone, benzoin, alkyl and aryl ethers of benzoin, m- or p-diacetylbenzene, 2-, or 3-, or 4-methoxybenzophenone, 3- or 4-allylacetophenone, and the like. The photoinitiators are employed at the usual known effective concentrations. Typically, the photoinitiator is employed at a concentration of up to about 10%, preferably from 1 to 5%, based on the weight of the termoplastic crosslinkable copolymer. Those skilled in the art are aware that photoactivators, or photosynergists, can be used in combination with the photoinitiators and synergistic effects are sometimes obtained. The suitable photoactivators are well known and require no further elaboration, however, one can mention as merely illustrative thereof methylamine, ethylamine, diethylamine, tributylamine, allylamine, 2-aminoethylethanolamine, tribenzylamine, piperidine, N-cyclohexylethyleneimine, and the like. They are employed in the usual known effective concentrations.

The thermoplastic, crosslinkable copolymer produced in accordance with our invention generally has a broader molecular weight distribution and wider melting range than a corresponding lactone homopolymer produced by a range than a corresponding lactone homopolymer produced by a similar process.

The thermoplastic, crosslinkabe copolymers of this invention can be employed in many applications. The degree of crosslinking imparted to the material will depend largely on the end use and on the processing or fabricating methods to be employed.

Typically, a thermoplastic, crosslinkable copolymer was produced by copolymerizing epsilon-caprolactone with 2 weight percent neopentyl glycol diacrylate according to the process of this invention, resulting in a product having a reduced viscosity of 0.77 and melt index, measured at 190° C., of 200 decigrams/min. The copolymer was discharged from the reactor in strands onto a cold moving belt and, upon solidifying, the strands were diced into pellets. Pellets exposed to 0.2 megarads of electron beam radiation exhibited a drop in melt index to 38 decigrams/min; pellets exposed to 0.3 megarads exhibited a drop in melt index to 1.8 decigrams/min. At these levels of crosslinking the copolymer exhibited no gel in methylene dichloride and their rheological characteristics were such that they could be blown into 1.5 mil film on a conventional blown film extrusion line. It is generally preferred to reduce the melt index to from 2 to 0.2 decigrams/min. for film blowing applications.

In the field of orthopedic therapeutic devices, custom, contour-fitting casts, splints, braces, and the like can be produced from the copolymers of this invention which have been crosslinked. The casts, splints, etc. made from this material have all the desirable properties of similar devices made from lactone homopolymers, as described in U.S. Pat. No. 3,692,023, however, they are considerably easier to apply due to the better handling characteristics at the application temperature. In the orthopedic applications it is generally preferred to employ the copolymer at levels of crosslinking such that it exhibits a gel fraction in an organic solvent such as methylene dichloride. The orthopedic therapeutic devices are produced by molding the crosslinked copolymer, typically in form of a sheet, web, or bandage to the body portion being treated. The copolymer used for this purpose can be crosslinked to a gel content of up to 90 weight percent, preferably from 20 to 70 weight percent, based on total weight of the copolymer.

The sheets or webs of crosslinked copolymer employed in the orthopedic applications can consist solely of the crosslinked copolymer or they can comprise composites or laminates, wherein the copolymer is bonded to or has embedded therein or is impregnated in a substrate material in the form of a sheet, web, netting, etc., of a different material.

Typically, a flexible orthopedic cast forming bandage material was formed by cryogenically grinding pellets of the thermoplastic, crosslinkable copolymer into a powder. The powder was electrostatically spray coated onto a nylon netting which had previously been coated with an electrically conductive coating. The netting having the copolymer coating fused thereon was exposed to 3 megarads of electron beam radiation to crosslink the copolymer. An orthopedic arm-wrist cast was formed from the bandage thus produced by: heating it to a temperature above the softening point of the crosslinked copolymer; wrapping the bandage around the arm and wrist, and between the thumb and forefinger, across the palm and thence back to the wrist in a series of overlying layers to build up a sufficient thickness of material to be rigid at room temperature; fusing the overlying layers into a unitary structure by the slight manual application of pressure; and cooling the cast to room temperature to rigidify it.

Other methods of producing orthopedic cast forming bandages include laminating a substrate, such as cotton gauze, with one or more layers of a sheet or film of the thermoplastic, crosslinkable copolymer. If desired the copolymer, in pellet form, can be lightly irradiated to reduce its melt index and render it more readily processable into a sheet or film by slot extrusion or blown film extrusion and, subsequent to laminating the sheet or film onto a substrate, it can be further irradiated to achieve the desired degree of stiffness for application as an orthopedic cast.

In producing orthopedic splints, it is convenient to employ the crosslinked copolymer in the form of a sheet of sufficient thickness that a single layer provides the desired degree of support and immobilization to the limb or body part being treated. The sheet is heated above the softening point of the copolymer and is thermoformed to the contour of the body part to which it is applied.

If desired, there can be present in the crosslinked copolymer up to about 20 weight percent, based on the weight of the copolymer, of particulate or fibrous fillers, such as reinforcing fillers, e.g., magnesium or calcium carbonate, finely divided silica, clay, asbestos, etc., or pigments, e.g. titanium dioxide. Dyes or other color agents can also be present if desired.

Orthopedic cast and splint forming materials of the crosslinked copolymers are soft and rubbery at the application temperatures, whereas the corresponding lactone homopolymers are considerably more fluid. Thus, the crosslinked copolymer is more easily handled and applied to the patient. If the material is heated in the form of a rolled bandage, the danger of the layers permanently sticking or fusing on the roll can be eliminated by the proper degree of crosslinking.

The advantages in processing which are provided by the copolymers of this invention are better understood with reference to the figures.

Figure 1:
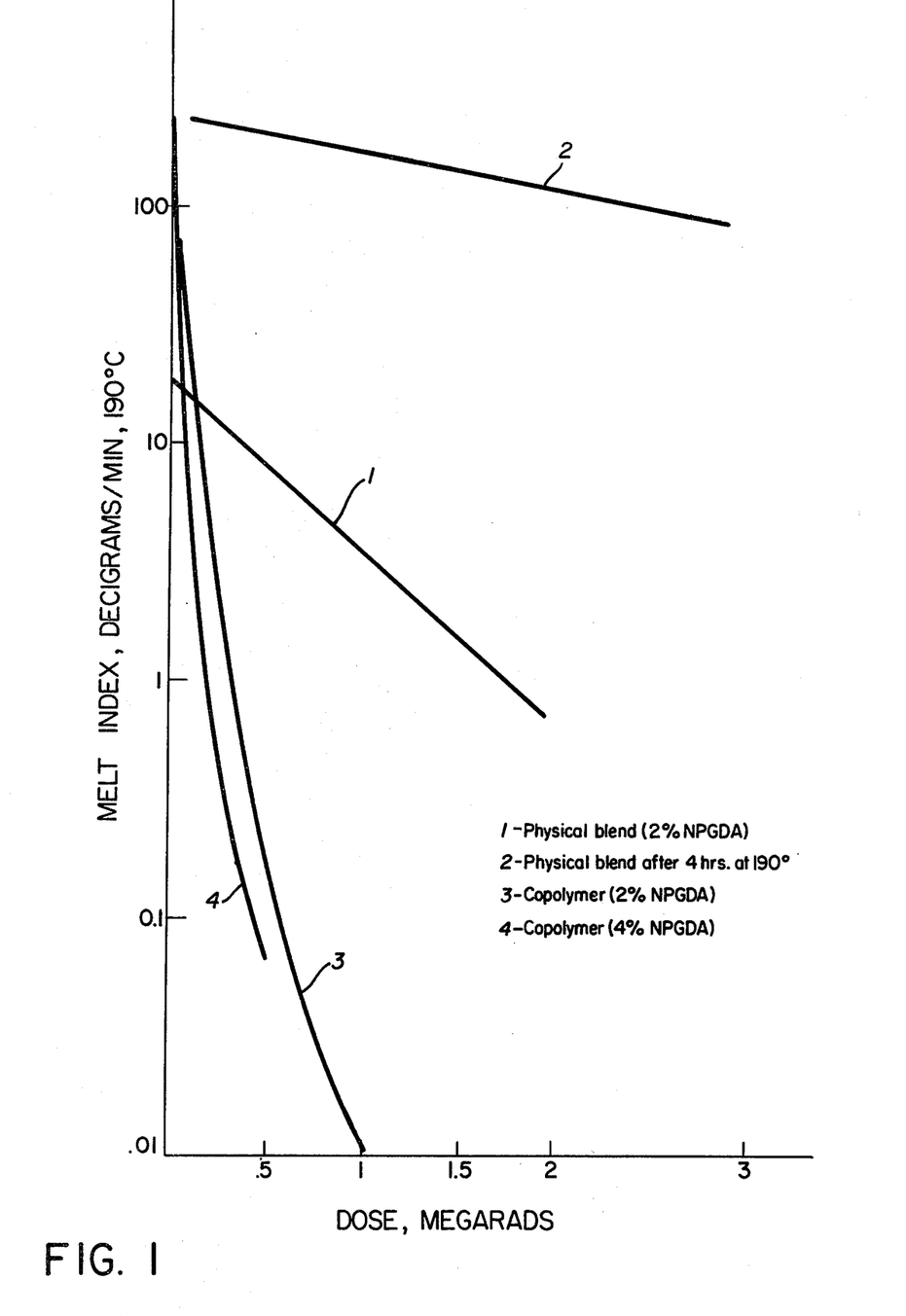
FIG. 1 is a graph which plots melt index at 190° C. as a function of radiation dosage of electron beam radiation for: a physical blend containing 98 weight percent of the poly-epsilon-caprolactone homopolymer and 2 weight percent neopentyl glycol diacrylate; the same physical blend after 4 hours at 190° C.; a copolymer of epsilon-caprolactone and neopentyl glycol diacrylate containing 2 weight percent neopentyl glycol diacrylate copolymerized therein; and a copolymer of epsilon-caprolactone and neopentyl glycol diacrylate contain- ing 4 weight percent neopentyl glycol diacrylate copolymerized therein.

FIG. 1 shows melt index at 190° C. as a function of electron beam radiation dose for copolymers of epsilon-caprolactone and neopentyl glycol diacrylate at 2% and 4% by weight neopentyl glycol diacrylate, as well as for a physical mixture of 98 weight percent poly-epsilon-caprolactone (reduced viscosity 0.8) and 2 weight percent neopentyl glycol diacrylate. For comparison purposes, the melt index of the poly-epsilon caprolactone is about 20 decigrams/min.

In the range from about 0.1 to 0.5 megarads, the copolymers displayed melt indexes in a range which is suitable for processing by means such as injection molding or extrusion. Yet, the melt index is sufficiently reduced at these levels of irradiation that the extrudate will not cause problems of dimensional instability during takeoff from the die.

Figure 2:
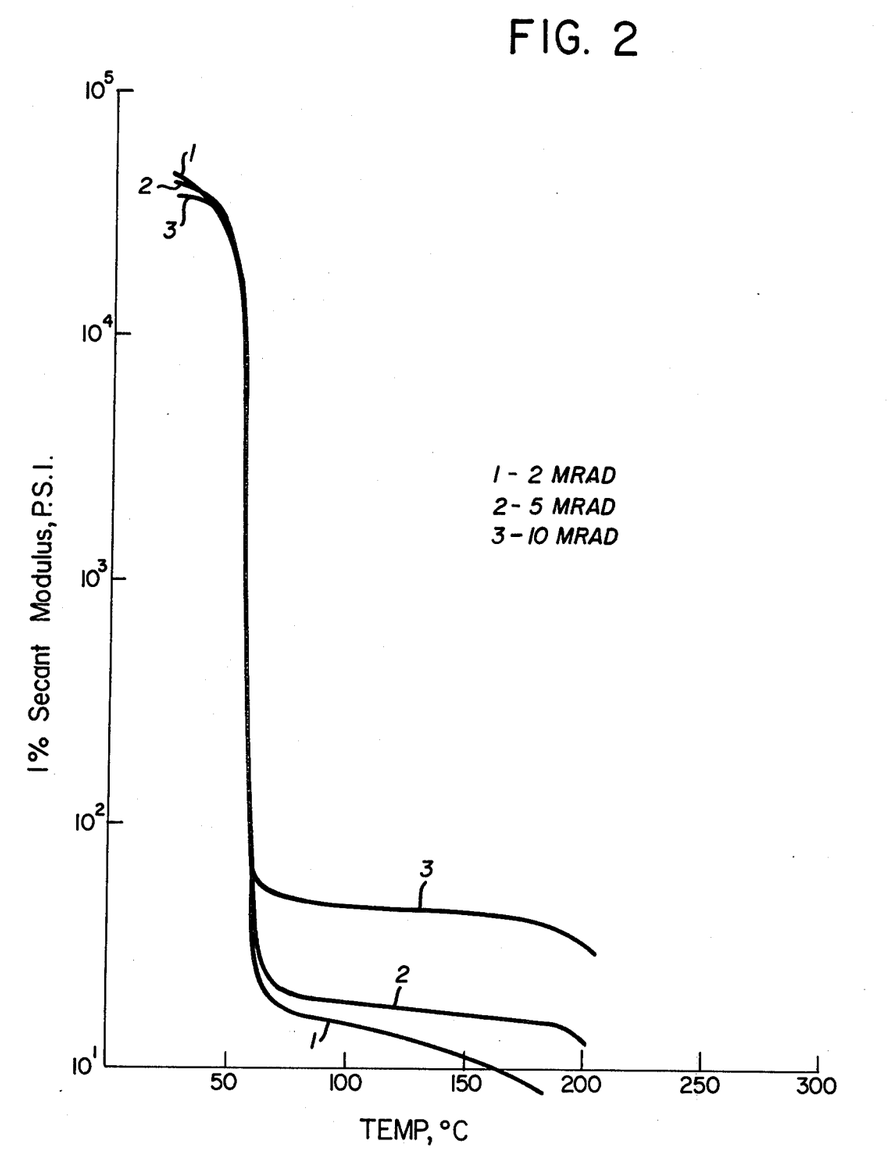
FIG. 2 is a graph which presents a series of stiffness-temperature curves which plot 1% secant modulus as a function of temperature for three crosslinked copolymers produced by irradiating a copolymer of epsilon-caprolactone and neopentyl glycol diacrylate (2 weight percent) with doses of 2, 5, and 10 megarads of electron beam radiation.

At higher levels of crosslinking (i.e. higher radiation dosage), the character of the material changes. FIG. 2 shows stiffness v. temperature for a series of copolymers of epsilon-caprolactone and neopentyl glycol diacrylate (2% by weight) which were irradiated with 2, 5, and 10 megarads of electron beam energy. These materials are characterized by an initial dropoff in stiffness followed by a broad temperature region in which they have a soft, rubbery consistency, represented by the relatively flat portion of the curves. As the level of crosslinking (i.e. radiation dosage) is increased, the soft, rubbery region occurs at a higher level of stiffness. Thus, sheets of the copolymer can be irradiated to provide optimum properties for thermoforming on commercial vacuum thermoformers. The stiffness of the material can be tailored for factors such as the depth of draw in the mold, desired wall thickness, sharpness of angles, etc.

Pellets of the thermoplastic, crosslinkable copolymer can be irradiated to a level of about 0.1 to 0.5 megarads to provide good properties for sheet extrusion and, if desired, the sheet thus formed can be further irradiated to a higher level of crosslinking to provide the desired properties for thermoforming. If desired, the sheet can be differentially irradiated across its surface. For example, suppose that one desires to thermoform a part in which stiffness is a general requirement, but a particular section has a deep draw or sharp angle which requires the material to flow freely to conform to the mold. The sheet can be only lightly irradiated in that portion which is required to flow freely in the mold and the remainder of the sheet irradiated to a higher level to provide the needed stiffness.

The copolymers of this invention can be molded by other conventional means, such as injection molding, compression molding, etc. Those skilled in the art will know the particular rheological properties required for each of the processes and will be able to adjust the properties of the copolymer accordingly.

The examples which follow are intended to further illustrate the invention described above and are not intended to unduly limit the invention in any way.

Unless otherwise stated, all parts and percents given in the examples are by weight. The following procedure was employed to determine double bond content (i.e., $>C=C<$).

Double Bond Content.

A small sample, on the order of 2 grams, was weighed into an Erlenmeyer flask, equipped with a condenser, into which there were also added 10 ml. of morpholine, 50 ml. of chloroform, and 20 ml. of acetic acid. The temperature of the contents was raised to about 50° C. for 30–45 min. to react the morpholine with the double bonds. The contents were then cooled to room temperature and titrated with 0.5 N perchloric acid in 2-methoxyethyl acetate to a thymol blue-xylene cyanol endpoint. A blank containing everything but the sample was also run. The double bond content was then calculated according to the equation.

$$\% \mathord{>}C{=}C\mathord{<} = \frac{(A - B) \times N \times 0.01201}{S.W.} \times 100$$

A = ml. of perchloric acid to titrate sample
B = ml. of perchloric acid to titrate blank
N = normality of perchloric acid
S.W. = sample weight.

As will be seen in the examples which follow, thermoplastic crosslinkable copolymers of this invention produced from monomer mixtures containing 98 weight percent epsilon-caprolactone and 2 weight percent neopentyl glycol diacrylate typically had double bond content of the neopentyl glycol diacrylate monomer, this would indicate that about 58% of the initial double bond unsaturation was present in the thermoplastic crosslinkable copolymer. Reduced viscosities were determined at 2 g./ml. in benzene.

EXAMPLE 1

To a 1-liter flask equipped with a thermometer, magnetic stirrer, nitrogen purge tube, and Brookfield viscometer there was charged a mixture of 882 grams of epsilon-caprolactone (containing 0.024 wt. % water), 18 grams of neopentyl glycol diacrylate (containing 0.24 wt.% water), and 0.282 ml. of stannous octoate. Due to the water content of the reactants no additional initiator was necessary. The reactants were heated with a heating mantle to a temperature of 177° C. After two hours the temperature of the reactants had risen to 182° C. and the viscosity was 6,000 cps. After an additional two hours of reaction an exotherm was reached at 221° C. The reaction was continued for an additional five hours, at which time the product had a viscosity of 310,000 cps at 140° C. The viscous, yellowish product was discharged into a pan lined with silicone-coated release paper. The yield of solid polymer was 99.61% of the material charged. The polymer had a reduced viscosity of 0.58 in benzene at 30° C. and a double bond content of 0.11%.

The solidified polymer was removed from the release paper and granulated in a grinder. Samples of the granulated polymer were irradiated with varying dosages of electron beam energy using a 2 MEV electron accelerator. After irradiation the samples were placed in benzene, tetrahydrofuran, and methylene dichloride and rated for relative degree of crosslinking on a scale of 0–6, with 6 representing the highest degree of crosslinking. At the lower crosslinking levels, degree of crosslinking was judged by viscosity increase whereas at the higher levels (i.e. 5 & 6) insoluble gel was apparent in the solvents.

| Radiation dose, megarads | Degree of Crosslinking | | |
|---|---|---|---|
| | $C_6H_6$ | $CH_2Cl_2$ | THF |
| 0 | 0 | 0 | 0 |
| 0.05 | 1 | 1 | 1 |
| 0.10 | 2 | 2 | 2 |
| 0.20 | 3 | 3 | 3 |
| 0.50 | 4 | 4 | 4 |
| 1.0 | 5 | 5 | 5 |
| 2.0 | 6 | 6 | 6 |

THF = tetrahydrofuran

EXAMPLE 2

A thermoplastic crosslinkable copolymer of epsilon-caprolactone and neopentyl glycol diacrylate was prepared by a procedure similar to that of Example 1, except that the reactants contained less water than those of Example 1. The reaction was carried out for about 9 hours, within an exotherm of 212° C. occurring after 4 hours, 15 min. After 9 hours the material had a viscosity of 740,000 cps at 130° C. The polymer was discharged onto silicone-coated release paper and cooled to room temperature. Yield of solid polymer was 99.3% and the polymer had a double bond content of 0.11%. Due to the lower amount of water used to initiate the reaction, the polymer in this example had a somewhat higher molecular weight than the polymer of Example 1, as indicated by a reduced viscosity in benzene of 0.72. Plaques ⅛-in. thick were compression molded from a portion of the thermoplastic crosslinkable copolymer and subjected to tensile testing. As a control, a conventional poly-epsilon-caprolactone homopolymer having a reduced viscosity of 0.95 was similarly tested and the results appear in the table below. Samples of the polymer granules were irradiated with varying dosages of electron beam radiation and tested for gel content in methylene dichloride. The gel content was observed to increase with increasing radiation dosage.

| | Secant modulus, p.s.i. | Tensile strength, p.s.i. | | Elongation, % | |
|---|---|---|---|---|---|
| | | at Yield | at Break | at Yield | at Break |
| PCL | 35,900 | 1,850 | 4,000 | 15 | 280 |
| Copolymer | 43,500 | 2,150 | 3,300 | 13 | 380 |

PCL = poly-epsilon-caprolactone

It can be seen that the thermoplastic copolymer of this invention had mechanical properties comparable to those of poly-epsilon-caprolactone homopolymer of considerably higher molecular weight.

EXAMPLE 3

Using a procedure similar to that of Example 1, a thermoplastic crosslinkable copolymer was produced by copolymerizing a monomer mixture containing 98 weight percent epsilon-caprolactone and 2 weight percent neopentyl glycol diacrylate, based on total monomer weight, using stannous octoate as a catalyst and the traces of water in the reactants as the initiator. Similarly, another thermoplastic crosslinkable copolymer was produced from a monomer mixture containing 96 weight percent epsilon-caprolactone and 4 weight percent neopentyl glycol diacrylate. There was also produced a physical blend of 98 weight percent of a poly-epsilon-caprolactone homopolymer having a reduced viscosity of 0.8 and 2 weight percent of neopentyl glycol diacrylate. Each of the copolymers and the physical blend were irradiated with varying dosages of electronic beam energy from a 2 MEV electron accelerator. Melt index readings at 1P (44 p.s.i.) and 190° C. were taken at varying dosage levels and the results are reported in the table below. It can be seen that the copolymer having 2% neopentyl glycol diacrylate copolymerized therein underwent a much more rapid crosslinking response than did the physical blend, as indicated by the faster drop in melt index upon exposure to radiation.

| Radiation, megarads | Melt Index, decigrams/min | | |
|---|---|---|---|
| | 98% PCL/ 2% NPGDA Blend | Copolymer, 2% NPGDA | Copolymer, 4% NPGDA |
| 0 | 18 | 233 | 551 |
| 0.1 | | 97 | 8.5 |
| 0.2 | | 3.1 | 0.83 |
| 0.3 | | 1.12 | 0.26 |
| 0.5 | 9.4 | 0.18 | 0.06 |
| 1.0 | 3.45 | 0 | 0 |
| 1.5 | 1.3 | 0 | 0 |
| 2.0 | 0.63 | 0 | 0 |

PCL = poly-epsilon-caprolactone
NPGDA = neopentyl glycol diacrylate

EXAMPLE 4

To a 350-gallon jacketed reactor there were charged 1,500 lbs. of epsilon-caprolactone, 30 lbs. of neopentyl glycol diacrylate, 0.6 lbs. of stannous octoate, and 1.5 lbs. of diethylene glycol as initiator. The temperature of the reaction mixture was adiabatically raised to 150° C. to start the reaction. The reaction was carried out for 15 hours, with two exotherms of 207° C. and 216° C. occurring after 1 hour and 1-½ hours. The product was discharged in strands onto a cooled conveyor belt and the solidified strands were diced to form pellets. The product had a reduced viscosity of 0.54, a melt viscosity of 42,000 cps. at 200° C. and a double bond content of 0.11%. The polymer pellets were compression molded into 10-mil thick plaques, which were irradiated with 1 megarad of electron beam energy from a 2 MEV electron accelerator. A portion of one of the irradiated plaques was placed in methylene dichloride and formed a substantial amount of gel. By comparison, a portion of the unirradiated copolymer dissolved completely in methylene dichloride.

A number of ⅛-inch thick compression molded plaques were produced and irradiated with 2, 5, and 10 megarad doses of electron beam radiation from a 2 MEV electron accelerator. The plaques were tested for mechanical properties and the results appear below.

| Dose, megarads | Modulus, p.s.i. | Tensile strength, p.s.i. | | Elongation, % | |
|---|---|---|---|---|---|
| | | at Yield | at Break | at Yield | at Break |
| 2 | 43,000 | 2,920 | 2,170 | 15 | 300 |
| 5 | 40,000 | 2,760 | 2,110 | 15 | 20 |
| 10 | 37,000 | 2,450 | 2,000 | 15 | 30 |

A portion of the thermoplastic, crosslinkable copolymer produced in Example 2 and a portion of the thermoplastic, crosslinkable copolymer produced in this example were each compression molded into a number of plaques of ⅛-inch thickness. The plaques were irradiated with 2, 5, and 10 megarads of electron beam energy from a 2 MEV electron accelerator. Finger splints were then formed from the irradiated plaques, as well as from plaques which had not been irradiated. In forming the splints, the plaques were first placed in a hot water bath until the copolymers, which were opaque at room temperature, became translucent, indicating they had passed their crystalline melting points. The softened plaques were then wrapped around a finger in a tube-like manner, the edges were overlapped and fused together, by the slight application of pressure, and the copolymers were allowed to cool to a rigid state. All of the irradiated copolymers were easily molded and fused, yet did not flow excessively or display dimensional instability during application. By comparison, the unirradiated plaques were rather fluid and difficult to handle during application. The applied splints held the fingers rigidly immobile.

EXAMPLE 5

Using a procedure similar to that of Example 1, a thermoplastic, crosslinkable copolymer was produced from a reaction mixture of 870.33 grams of epsilon-caprolactone, 18 grams of neopentyl glycol diacrylate, 0.282 ml. of stannous octoate, and 11.67 grams of polyoxypropylene glycol (viscosity at 25° C., 300 centistokes) as an initiator. The product was discharged into a pan lined with silicon-coated release paper. The reduced viscosity of the product was 0.62 and the double bond content, in two repetitive tests, was 0.11 and 0.10%. A piece of the copolymer was dissolved in methylene dichloride and formed no gel. Another piece of the copolymer was placed under an ultraviolet light overnight and then placed in methylene dichloride, whereupon insoluble gel was observed, indicating that crosslinking had occurred.

EXAMPLE 6

Using a procedure similar to that of Example 1, a thermoplastic crosslinkable copolymer was produced by polymerizing a reaction mixture of 877.5 grams of epsilon-caprolactone, 18 grams of neopentyl glycol diacrylate, 0.282 ml. of stannous octoate, and 4.5 grams of butylated hydroxytoluene (BHT) as an initiator. The product was discharged into a pan lined with a silicone-coated release paper. It had a reduced viscosity of 0.58 and a double bond content, in two repetitive tests, of 0.10 and 0.11%. A piece of the copolymer was placed in methylene dichloride and found to be soluble. Another piece of the copolymer was placed under an ultraviolet lamp overnight and then placed in methylene dichloride, whereupon gel was observed, indicating that crosslinking had occurred.

EXAMPLE 7

Using a procedure similar to that of Example 1, a thermoplastic crosslinkable copolymer was produced by polymerizing a reaction mixture of 881 grams of epsilon-caprolactone, 19 grams of trimethylolpropane trimethacrylate, and 0.282 ml. of stannous octoate. The water present in the reactants was sufficient to initiate the polymerization without any additional initiator. The viscous reaction product was discharged into a pan lined with a silicone-coated release paper. The copolymer had a reduced viscosity of 0.67 and a double bond content of 0.05%. A piece of the copolymer was observed to be soluble in methylene dichloride. Another piece of the copolymer was placed under an ultraviolet light overnight and then placed in methylene dichloride, whereupon insosuble gel was observed, indicating that crosslinking had occurred.

EXAMPLE 8

Using a procedure similar to that of Example 1, thermoplastic crosslinkable copolymers were produced from monomer mixtures containing 90 weight percent epsilon-caprolactone and 10 weight percent neopentyl glycol diacrylate, based on the total weight of those monomers. Two runs were carried out. In both runs, the polymerization mixture charged to the flask consisted of 771.426 grams of epsilon-caprolactone, 86.256 grams of neopentyl glycol diacrylate, 0.282 ml. of stannous octoate, and 42.309 grams of diethylene glycol as an initiator. In the first run the reaction was carried out for about 9 hours, as in Example 1, however, in the second run the reaction was terminated and the product discharged after 1½ hours. The copolymer of the first run had double bond content measurements of 0.38 and 0.36% in two repetitive tests. The copolymer of the second run had double bond content measurements of 0.6 and 0.62% in two repetitive measurements. Pieces of both copolymers were observed to be soluble in methylene dichloride. Pieces of each copolymer were irradiated with 2, 5, and 10 megarads of electron beam radiation from a 2 MEV electron accelerator. In the case of both copolymers, the irradiated samples all exhibited insoluble gel formation in methylene dichloride, with the gel fraction increasing with increased radiation dosage.

EXAMPLE 9

Using a procedure similar to that of Example 1, a thermoplastic crosslinkable copolymer was produced by polymerizing a reaction mixture of 873.5 grams of epsilon-caprolactone, 26.5 grams of 3'-acryloxy-2', 2'-dimethylpropyl 3-acryloxy-2,2-dimethylpropionate and 282 ml. stannous octoate. The water contained in the reactants was sufficient to initiate reaction without the use of added initiator. The reaction was carried out for about 11 hours. The final product has a viscosity of 140,000 cps. at 187° C. and a reduced viscosity of 0.58. The double bond content of the copolymer, in two repetitive measurements, was 0.13 and 0.11%.

EXAMPLE 10

To a 350-gallon jacketed reactor there were charged 2,000 lbs. of epsilon-caprolactone, 40 lbs. of neopentyl glycol diacrylate, and 365 grams of stannous octoate. Trace water contained in the reaction mixture was the sole initiator employed. The temperature of the reactants was raised to 200° C. and the reaction was allowed to proceed for 15 hours. Prior to raising the temperature, a small sample of the reactant mixture was taken out of the reactor and placed in a thermocell. The reaction temperature in the thermocell was regulated to 200° C. and the reaction in the thermocell was allowed to proceed for 39 hours. The viscous, yellowish reaction product in the reactor was discharged in strands onto a cooled belt and the solidified strands were diced into pellets. A sample of the copolymer taken near the beginning of the reactor discharge had a reduced viscosity of 0.77 and a double bond content, in two repetitive measurements, of 0.09 and 0.08%. After 2 months this sample had a reduced viscosity of 0.74 and a crystallization time of 88 seconds. A sample of the copolymer taken near the end of the reactor discharge had a reduced viscosity of 0.81 and a double bond content, in two repetitive measurements, of 0.1 and 0.77%. After 2 months this sample had a reduced viscosity of 0.77 and a crystallization time of 77 seconds. The reaction produce from the thermocell had a reduced viscosity of 0.89, double bond content, in two repetitive measurements, of 0.09 and 0.08%, and a crystallization time of 49 seconds.

The thermoplastic crosslinkable copolymer produced above had a melt index, at 190° C. and 1P (44 p.s.i.), of 200 decigrams/min. A first portion of the copolymer pellets was irradiated with 0.2 megarads of electron beam radiation from a 2 MEV electron accelerator. The melt index of this irradiated portion, at 1P and 190° C. was 38 decigrams/min. A second portion of copolymer pellets was irradiated with 0.3 megarads of electron beam irradiation from the 2 MEV electron accelerator. The melt index, at 1P and 190° C. of the second irradiated portion was 1.8 decigrams/min.

Each of the irradiated copolymers was extruded through a blown film die. The copolymer which had been irradiated with 0.2 megarads produced a film of 1.5 mils thickness having a width of 9⅝ inches after the blown film tube was flattened. The copolymer which had been irradiated with 0.3 megarads produced a film of 1.5 mils thickness having a width of 9 inches after the blown film tube was flattened. The blown films were translucent.

Compression molded plaques ⅛ inch thick were prepared from a portion of the thermoplastic, crosslinkable copolymer and exposed to 1, 2, 3, 4, and 5 megarads of electron beam energy from a 2 MEV electron accelerator. Using a Soxlet extractor, it was determined that the irradiated plaques contained gel contents, measured in methylene dichloride, of 37.4%, 47.5%, 51.4%, 50.8% and 56.1%, respectively.

EXAMPLE 11

900 grams of the thermoplastic, crosslinkable copolymer produced in Example 10 and 100 grams of titanium dioxide pigment were charged to a blender and physically blended for ½ hour. The mixture was then extrusion blended in a 1-inch screw diameter extruder. The material was discharged through a strand die into an ice bath to solidify the strands. The solidified strands were diced into pellets. The pellets were cryogenically ground in a laboratory micropulverizer at −150 to −200° C. to produce a powder.

Several 2-inch wide strips of nylon netting, each 5 ft. in length (86 strands per ft.), were dipped in a solvent solution of an electrically conductive coating (supplied under the tradename Ransprep ®, Ransburg Electro-Coating Corp.) and the solvent was evaporated. The netting having the electrically conductive coating on its surface was electrostatically spray coated with the thermoplastic, crosslinkable copolymer powder. Applied coating weight was about 80 weight percent of the total weight of the coated netting. When the applied powder coating had been fused, the openings between the strands of the coated substrate were still present; that is, the coating did not bridge or close the openings.

The netting having the thermoplastic crosslinkable copolymer coating on its surfaces was irradiated with 3 megarads of electron beam energy from a 2 MEV electron accelerator to crosslink the copolymer.

The strips of netting having the crosslinked copolymer on their surfaces were rolled, placed into a 650-watt microwave oven, and heated to about 75° C., at which temperature the copolymer became soft and moldable, but not highly fluid. A cloth stockinette was placed over the forearm of a subject. The heated, coated strips of netting were then used as an orthopedic cast forming bandage to apply a forearm-wrist cast to the subject. The heated bandage was drawn off the roll, with no sticking problems, and wrapped around the forearm and wrist, passing over the back of the hand, between the thumb and forefinger, across the palm, thence back to the wrist. A series of layers was applied in this manner, taking tucks wherever necessary, to build up a sufficient thickness of material to provide support and immobilization of the limb at room temperature. With a slight application of pressure to ensure good surface contact between the overlying layers, the copolymer on the layers fused together so that a unitary cast was formed. When the cast had cooled to room temperature, it was rigid, porous, and contour fitting and held the arm and wrist rigidly in place.

EXAMPLE 12

To a 350-gallon jacketed reactor there were charged 4,000 lb. of epsilon-caprolactone, 80 lb. of neopentyl glycol diacrylate, and 726 grams of stannous octoate. Trace amounts of water in the reactants were sufficient to act as a polymerization initiator. The temperature of the reactants was raised to 150° C. to start the reaction. The reaction proceeded for about 16 hours, with an exotherm of 224° C. occurring after about 5 hours. The viscous product was discharged in strands onto a cooled conveyor belt and the solidified strands were diced into pellets. The product has a reduced viscosity of 0.5.

Strips of unsized knitted nylon netting, each 4 inches in width and 5 ft. in length (86 strands per ft.), were mounted in a fume hood. A 10 weight percent solution of the copolymer produced above, in methylene dichloride, was prepared. There was then added to the solution 10 weight percent titanium dioxide, based on the weight of the copolymer. The solution thus prepared was sprayed on both sides of the nylon netting. After drying overnight, the applied coating weight was about 80 weight percent of the total weight of the coated netting. The copolymer on the netting was crosslinked by exposure to 3 megarads of electron beam energy from a 2 MEV electron accelerator. The gel content of the crosslinked copolymer on the netting was determined to be 54 weight percent, using a Soxlet extractor.

The strips of netting having the coating of crosslinked copolymer on their strands were employed as an orthopedic cast forming bandage. The strips of bandage were rolled, placed in a 650-watt microwave oven, and heated to a temperature at which the copolymer became soft and moldable. A cloth stockinette was placed over the lower leg and foot. The heated bandage was drawn off the roll and wrapped around the lower leg, ankle, and foot in a series of overlying layers to build up a sufficient thickness of material to provide support and immobilize the limb at room temperature. The overlying layers were fused together by the slight application of pressure to ensure good surface contact. The cast was allowed to cool. It formed a rigid, porous cast which held the lower leg and foot in a rigid position. The applied cast had sufficient load-bearing strength to allow the subject to walk on it without bending or breaking it.

What is claimed is:

1. Process of producing a thermoplastic crosslinkable copolymer which comprises reacting, at a temperature of from 25 to 300° C., an active-hydrogen containing initiator with a molar excess of a monomer mixture comprising:
   (A) from 90 to 99.5 weight percent of a lactone monomer of the formula wherein n is an integer having a value from about 3 to 6, at least n+2 of the R's are hydrogen, and the remaining R's are each alkyl of 1 to 10 carbon atoms; and
   (B) from 0.5 to 10 weight percent of a polyfunctional acrylate monomer containing a plurality of acrylate or methacrylate groups.

2. Process for producing a thermoplastic crosslinkable copolymer as claimed in claim 1, wherein said monomer mixture comprises from 95 to 99.5 weight percent of said lactone monomer and from 0.5 to 5 weight percent of said polyfunctional acrylate monomer.

3. Process for producing a thermoplastic crosslinkable copolymer as claimed in claim 1 wherein said lactone is epsilon-caprolactone.

4. Process for producing a thermoplastic crosslinkable copolymer as claimed in claim 3, wherein said polyfunctional acrylate is neopentyl glycol diacrylate.

5. Process for producing a thermoplastic crosslinkable copolymer as claimed in claim 3, wherein said polyfunctional acrylate is trimethylolpropane trimethacrylate.

6. Process for producing a thermoplastic crosslinkable copolymer as claimed in claim 3, wherein said polyfunctional acrylate is 3'-acryloxy-2',2'-dimethylpropyl 3-acryloxy-2,2-dimethylpropionate.

7. The thermoplastic crosslinkable copolymer which is produced by the process of claim 1.

8. The thermoplastic crosslinkable copolymer which is produced by the process of claim 2.

9. The thermoplastic crosslinkable copolymer which is produced by the process of claim 3.

10. The thermoplastic crosslinkable polymer which is produced by the process of claim 4.

11. The thermoplastic crosslinkable copolymer which is produced by the process of claim 5.

12. The thermoplastic crosslinkable copolymer which is produced by the process of claim 6.

13. A thermoplastic crosslinkable copolymer as claimed in claim 7, wherein said thermoplastic crosslinkable copolymer has a reduced viscosity of from 0.1 to 2.

* * * * *

UNITED STATES PATENT AND TRADEMARK OFFICE
CERTIFICATE OF CORRECTION

PATENT NO. : 4,175,177
DATED : November 20, 1979
INVENTOR(S) : James E. Potts

It is certified that error appears in the above-identified patent and that said Letters Patent are hereby corrected as shown below:

At Column 13, line 64, "of 0.1 and 0.77%." should read --of 0.1 and 0.07%.--.

Claim 10, Column 16, line 51, "crosslinkable polymer" should read --crosslinkable copolymer--.

Signed and Sealed this

Eighth Day of April 1980

[SEAL]

Attest:

SIDNEY A. DIAMOND

Attesting Officer

Commissioner of Patents and Trademarks